(12) United States Patent
McComb et al.

(10) Patent No.: US 9,263,855 B2
(45) Date of Patent: Feb. 16, 2016

(54) INJECTION LOCKING OF GAIN SWITCHED DIODES FOR SPECTRAL NARROWING AND JITTER STABILIZATION

(71) Applicant: nLight Photonics Corporation, Vancouver, WA (US)

(72) Inventors: Timothy S. McComb, Portland, OR (US); Dennis McCal, Lake Oswego, OR (US)

(73) Assignee: nLight Photonics Corporation, Vancouver, WA (US)

( * ) Notice: Subject to any disclaimer, the term of this patent is extended or adjusted under 35 U.S.C. 154(b) by 0 days.

(21) Appl. No.: 13/835,354

(22) Filed: Mar. 15, 2013

(65) Prior Publication Data

US 2014/0269788 A1 Sep. 18, 2014

(51) Int. Cl.
| | |
|---|---|
| *H01S 3/30* | (2006.01) |
| *H01S 5/40* | (2006.01) |
| *H01S 5/00* | (2006.01) |
| *H01S 5/024* | (2006.01) |
| *H01S 5/042* | (2006.01) |
| *H01S 5/06* | (2006.01) |
| *H01S 5/062* | (2006.01) |

(52) U.S. Cl.
CPC ............... *H01S 5/4006* (2013.01); *H01S 5/005* (2013.01); *H01S 5/0064* (2013.01); *H01S 5/0078* (2013.01); *H01S 5/02415* (2013.01); *H01S 5/042* (2013.01); *H01S 5/0612* (2013.01); *H01S 5/06216* (2013.01)

(58) Field of Classification Search
CPC ....................................................... H01S 3/10
USPC ............................................................. 372/6
See application file for complete search history.

(56) References Cited

U.S. PATENT DOCUMENTS

| | | | |
|---|---|---|---|
| 4,166,985 A | 9/1979 | White et al. | |
| 4,264,870 A | 4/1981 | Avicola et al. | |
| 4,503,403 A * | 3/1985 | Taylor et al. | ..................... 331/37 |
| 4,608,697 A * | 8/1986 | Coldren | ....................... 372/50.1 |
| 4,635,246 A * | 1/1987 | Taylor et al. | ..................... 398/79 |
| 4,866,720 A | 9/1989 | Holly | |
| 5,778,015 A * | 7/1998 | Gunning et al. | ................. 372/25 |
| 5,778,016 A * | 7/1998 | Sucha et al. | ................. 372/38.1 |
| 5,987,042 A | 11/1999 | Staver et al. | |
| 6,208,672 B1 * | 3/2001 | Gunning et al. | ................. 372/12 |
| 6,243,195 B1 | 6/2001 | Pedersen et al. | |

(Continued)

OTHER PUBLICATIONS

Margalit, "Injection locking of an actively mode-locked semiconductor laser", Optics Letters vol. 19, No. 24, 2125, Dec. 15, 1994.*

(Continued)

*Primary Examiner* — Xinning Niu
*Assistant Examiner* — Vu A Vu
(74) *Attorney, Agent, or Firm* — Klarquist Sparkman, LLP

(57) ABSTRACT

Pulse power can be stabilized by applying spectrally narrow pulses to a laser diode during gain switching. An injection locking laser with a narrow emission bandwidth is tuned to a gain bandwidth of a laser diode to be gain switched. The injection locking emission is pulsed to provide locking pulses that are attenuated and then coupled to a laser diode. A gain switching pulse drive is applied to the laser diode in the presence of the attenuated locking pulses. The gain switched output is then stabilized with respect to pulse energy and pulse amplitude, and is suitable as a seed pulse for lasers to be used in materials processing.

25 Claims, 6 Drawing Sheets

(56) References Cited

U.S. PATENT DOCUMENTS

| | | | |
|---|---|---|---|
| 6,590,922 B2* | 7/2003 | Onkels et al. | 372/57 |
| 6,661,820 B1 | 12/2003 | Camilleri et al. | |
| 7,324,788 B2* | 1/2008 | Ramet et al. | 455/76 |
| 7,391,794 B2* | 6/2008 | Kane | 372/10 |
| 7,582,848 B2* | 9/2009 | Smart | 219/121.69 |
| 7,608,808 B2* | 10/2009 | Kuramoto | 250/205 |
| 7,964,819 B2* | 6/2011 | Bruland | 219/121.62 |
| 8,254,419 B1* | 8/2012 | Savage-Leuchs et al. | 372/25 |
| 8,532,151 B2 | 9/2013 | Li et al. | |
| 2002/0097761 A1* | 7/2002 | Sucha et al. | 372/30 |
| 2002/0114370 A1 | 8/2002 | Onkels et al. | |
| 2002/0196823 A1* | 12/2002 | Nakao et al. | 372/32 |
| 2003/0197918 A1* | 10/2003 | Ng et al. | 359/332 |
| 2003/0202168 A1 | 10/2003 | Barenz et al. | |
| 2004/0190119 A1* | 9/2004 | Tauser et al. | 359/333 |
| 2005/0018724 A1* | 1/2005 | Da Silva et al. | 372/32 |
| 2007/0064747 A1 | 3/2007 | Feve et al. | |
| 2007/0223544 A1 | 9/2007 | Yamazaki et al. | |
| 2007/0268940 A1* | 11/2007 | Luo et al. | 372/20 |
| 2008/0089369 A1* | 4/2008 | Luo et al. | 372/28 |
| 2009/0046746 A1 | 2/2009 | Munroe et al. | |
| 2009/0201952 A1* | 8/2009 | Luo et al. | 372/5 |
| 2009/0296755 A1* | 12/2009 | Brown et al. | 372/22 |
| 2010/0038558 A1 | 2/2010 | Yamazoe | |
| 2010/0189136 A1* | 7/2010 | Gapontsev et al. | 372/6 |
| 2010/0189141 A1 | 7/2010 | Zhang et al. | |
| 2011/0062127 A1* | 3/2011 | Gu et al. | 219/121.69 |
| 2011/0122912 A1* | 5/2011 | Benjamin et al. | 372/50.124 |
| 2011/0142084 A1* | 6/2011 | Reid et al. | 372/20 |
| 2012/0087386 A1* | 4/2012 | Brown et al. | 372/55 |
| 2012/0242973 A1 | 9/2012 | Tünnermann et al. | |
| 2013/0114627 A1 | 5/2013 | Filgas et al. | |

OTHER PUBLICATIONS

Koechner, *Solid State Laser Engineering*, 6$^{th}$ edition, pp. 268-270 (2006).

Seo et al., "Timing jitter reduction of gain-switched DFB laser by external injection-seeding," Elec. Lett. 32(1): pp. 44-45 (1996).

Johann Nilsson, "High-power fiber lasers: Surge to power," SRC Annual Meeting, Sep. 19-21, pp. 21-23, (2005).

Office action dated Apr. 10, 2014, from U.S. Appl. No. 13/758,904, 16 pages.

International Search Report and Written Opinion from International Application No. PCT/US2014/027709, dated Sep. 12, 2014, 11 pages.

Office Action from United States Patent & Trademark Office in co-pending U.S. Appl. No. 13/758,904, dated Feb. 3, 2015, 18 pages.

* cited by examiner

INJECTION LOCKING OF GAIN SWITCHED DIODES FOR SPECTRAL NARROWING AND JITTER STABILIZATION

FIELD

The disclosure pertains to laser systems for materials processing.

BACKGROUND

High power laser systems can be used in materials processing to cut, scribe, weld, or perform other processes. Bulky laser systems such as solid state lasers and gas lasers have been displaced in many applications by diode laser based systems. In some applications, diode lasers are suitable, while in other applications, diode pumped fiber lasers or other diode pumped lasers are preferred.

Diode laser properties have been extensively studied for use in telecommunications applications such as described in Gunning et al., U.S. Pat. No. 6,208,672 and Seo et al., "Timing jitter reduction of gain switched DFB laser by external injection seeding," Elect. Lett. 32:44-45 (1996). Telecommunications applications typically use pulse powers that are substantially lower than the powers needed in materials processing and require low pulse jitter to provide acceptable bit error rates. Materials processing systems must meet different requirements that are not addressed by prior art telecommunications lasers, and improved laser systems and methods are needed for such applications.

SUMMARY

Methods and apparatus are disclosed that permit amplitude-stable laser pulse generation. In one example, a primary laser system includes a primary laser that emits primary laser pulses and an optical system is configured to attenuate the primary laser pulses. A secondary laser system includes a secondary laser configured to receive the attenuated primary laser pulses from the optical system and produce secondary laser pulses. A control system is coupled to at least one of the primary laser system or the secondary laser system and is configured to set a wavelength associated with the primary laser pulses to correspond to a wavelength associated with the secondary laser. The control system is further configured to establish an optical pulse delay so that primary pulses are received at the secondary laser as respective secondary laser pulses are produced. Delays are typically between 1 ns and 100 ns. In some examples, the control system includes at least one temperature control system that is coupled to at least one of the primary laser or the secondary laser and configured to set the wavelength associated with the primary laser pulses to correspond to the wavelength associated with the secondary laser based on a temperature of at least one of the primary laser or the secondary laser. Typically, the primary laser and the secondary laser are laser diodes. In representative examples, the primary laser system includes a primary laser driver and the secondary laser system includes a secondary laser driver. The control system is coupled so that drive pulses produced by the primary laser driver and the secondary laser driver are initiated with a driver pulse delay based on the optical pulse delay. In typical examples, the primary laser driver is configured to provide primary laser pulses having a pulse duration of less than 500 ns, 100 ns, or 50 ns. In still other examples, an optical amplifier is configured to receive the secondary laser pulses and produce amplified pulses having an output spectrum based on a spectrum of the secondary laser pulses. In other embodiments, the optical system includes at least one of a lossy fiber splice or a fiber coupler situated to attenuate the primary laser pulses, and the optical system provides an attenuation of at least 10 dB or 20 dB. According to some examples, the primary laser is a distributed feedback laser and the secondary laser is a microchip laser or a gain-switched laser diode.

Pulsed fiber laser systems comprise a fiber amplifier that includes an actively doped optical fiber and a pump source configured to pump the actively doped optical fiber to provide optical gain. A seed laser system is configured to provide spectrally controlled seed laser pulses to the fiber amplifier, wherein the seed laser system includes a gain switched laser diode configured to provide the spectrally controlled seed laser pulses. In further examples, the seed laser system includes an injection locking laser diode optically coupled to the gain switched laser diode so as to spectrally control the seed laser pulses. According to some examples, a delay generator is configured so that pulses from the injection locking laser are received at the gain switched laser diode so that the seed laser pulses are spectrally controlled. In still more examples, the seed laser system includes an optical attenuator configured to attenuate the pulses from the injection locking laser by at least 10 dB, 20 dB, or 30 dB, and couple the attenuated pulses to the gain switched laser diode. In representative examples, the injection locking laser is a distributed feedback (DFB) laser, a distributed Bragg reflector (DBR) laser, or a volume Bragg grating (VBG) laser. In other examples, the gain switched laser diode is a distributed feedback (DFB) laser, a distributed Bragg reflector (DBR) laser, a volume Bragg grating (VBG) laser, or a Fabry-Perot laser. According to representative examples, the seed laser system includes a temperature controller configured to tune emission wavelengths of at least one of the gain switched laser diode or the injection locking laser diode to a common wavelength. In further examples, a substrate stage and a beam forming optical system are configured to receive the amplified seed pulses from the fiber amplifier and form a shaped optical beam. The substrate stage and the beam forming optical system are configured to scan the shaped optical beam with respect to a substrate based on motion of the substrate stage, the shaped optical beam, or both. In some embodiments, the amplified seed pulses are produced at a repetition rate of between 1 kHz and 100 MHz, and the shaped optical beam is scanned so that selected amplified seed pulses overlap at the substrate by less than one half of a shaped beam diameter, overlap completely, or overlap by 50%, 75%, 90%, or 99%.

Methods comprise tuning a first laser diode and a second laser diode to a common wavelength, wherein the first laser diode is a single mode laser diode. Portions of optical pulses from the first laser diode are directed to the second laser diode, and pulses are generated with the second laser diode as the portions of the optical pulses from the first laser diode are received so as to control a spectrum of the generated pulses. In some examples, generating pulses with the second laser diode comprises gain switching the second laser diode. In further examples, the portions of the optical pulses from the first laser diode are coupled so that side mode amplitudes in the spectrally controlled, gain switched pulses from the second laser diode are attenuated by at least 10 dB with respect to spectrally uncontrolled gain switched pulses from the second laser diode.

The foregoing and other objects, features, and advantages of the disclosed technology will become more apparent from the following detailed description, which proceeds with reference to the accompanying figures.

DETAILED DESCRIPTION

Figure 1:
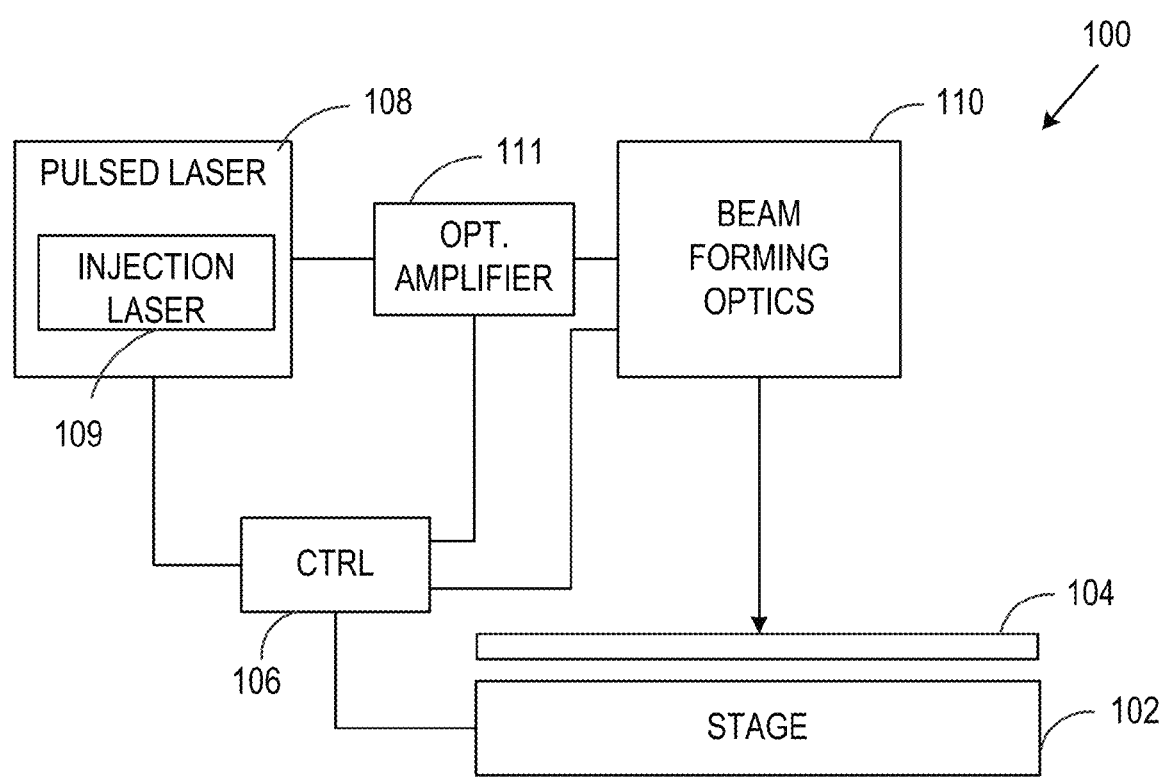
FIG. 1 is a block diagram of a representative materials processing system that includes injection seeded laser systems as disclosed herein.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

In the examples below, a first or primary laser is used to produce a laser output that is coupled to a secondary laser so that laser pulses from the secondary laser are spectrally confined or controlled. The primary laser thus "injection locks" the secondary laser output based on the spectrum of the primary laser output. As used herein, an injection locking laser or an injection laser refers to a laser whose output is directed to a second laser to control the spectrum of the second laser. An injection locking laser has at least some gain bandwidth overlap with the secondary laser. Injection lasers are generally selected to operate in a signal longitudinal mode that is at a frequency corresponding to an emission frequency of a seed laser or other laser whose spectral output is to be controlled. In most examples, an injection laser is spectrally matched to within 20%, 10%, 5%, 2%, 1% or less of a longitudinal mode spacing of the laser to be locked so that side modes are suppressed by 15, 20, 25, 30, 40, or 50 dB. Typical matching is within 0.5 nm or less, such as within 0.2 nm or 0.1 nm. Spectral overlap can be obtained by temperature tuning or other methods. Injection lasers are also generally operated to provide injection pulses to reduce DC light emission that is in-band with seed pulses or other spectrally controlled pulses, and hence cannot be removed by spectral filters. In typical examples, the primary laser driver is configured to provide primary laser pulses having a pulse duration of less than 500 ns, 100 ns, or 50 ns.

Some examples refer to a seed lasers and seed pulses. As used herein, a seed laser pulse is an output of seed laser that is directed to an optical amplifier or optical oscillator to stimulate pulse emission. A seed laser pulse is generally selected to be at or near a maximum of a gain bandwidth of the optical amplifier or optical oscillator. Although some examples describe seed pulses and subsequent amplification, seed pulses can be used for some applications without additional amplification. The examples described below are based on laser diodes and doped optical fibers, and the associated wavelengths and wavelength ranges. Other types of lasers and optical amplifiers can be used based on solid state or other optical gain materials. For example, microchip lasers based on sections of solid state laser media can be used. Typical seed laser pulse durations are between 10 ps and 10 ns and are produced at repetition rates of 10 kHz to 100 MHz. In the examples below, based on laser diodes, DC and pulsed currents are supplied to pump the laser diodes. Such currents are referred to as drive currents. For other laser systems, different types of pumping are necessary. In typical examples, amplitude stable pulsed laser outputs are produced in which total pulse energies and pulse amplitudes are within 20%, 10%, 5% or 2% of average pulse energies and amplitudes.

Referring to FIG. 1, a materials processing system 100 includes a stage 102 that is configured to retain a workpiece 104 such as a silicon wafer, a glass substrate, or other material to be processed. The stage 102 is coupled to a controller 106 that can direct stage motion so as to position the workpiece 104 along one or more axes. A laser system 108 is configured to provide pulsed or continuous optical beams to an optical amplifier 111 and a beam forming optical system 110. The beam forming optical system 110 shapes the optical beam or beams to provide an output beam having a cross-section of a suitable size and shape. The beam forming optical system 110 can be configured to permit beam scanning with mechanical stages or optical scanners, so that output beams can scanned with respect to a stationary target. Alternatively, the output beam and the workpiece 104 can be cooperatively scanned as directed by the controller 106. In some applications, line beams are preferred while in other applications, a focused spot is preferred. Beam cross-sections can be selected based on feature dimensions on the substrate, beam depth of focus, beam intensities, or other properties.

In one example, the laser system 108 provides a repetitively pulsed beam at pulse rates of between 1 kHz and 100 MHz or between 10 kHz and 10 MHz that is amplified in the optical amplifier 111 and delivered to the workpiece 104 as a focused, approximately symmetrical spot. The beam and workpiece 104 are scanned so that a continuous line on the workpiece 104 is processed. The processing can be configured for laser ablation, welding, scribing, annealing, cutting, sintering, micro-machining or other processes. In most applications, a scan rate and pulse repetition rate are selected so that sequential spots at least partially overlap on the workpiece 104, and pulse-to-pulse energy variation does not result in significant processing differences at different locations. The laser system 108 and the scan procedure are configured to provide amplitude stable, repetitive pulses, without gaps due to low energy or low amplitude pulses. Such pulses and the associated gaps result in processed workpieces that fail to satisfy manufacturing tolerances. The laser system 108 can proved suitable amplitude stable, repetitive pulses by including an injection laser 109 as disclosed further below.

Figure 2:
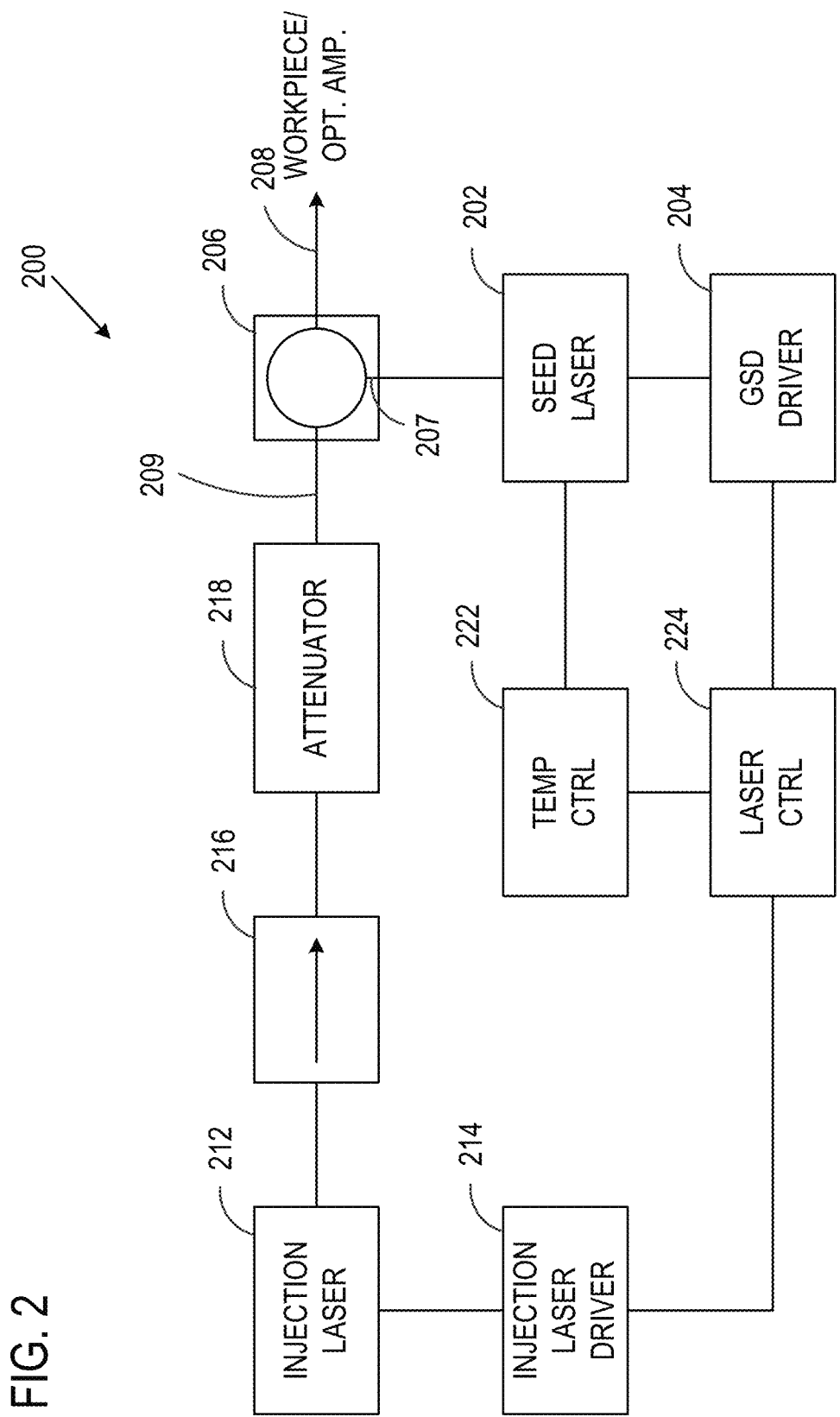
FIG. 2 is a schematic diagram of a representative injection locked seed laser system based on a gain switched laser diode.

Referring to FIG. 2, a laser system 200 includes a laser diode "seed" laser 202 that is coupled to a laser diode driver 204 that provides suitable drive currents for the laser diode 202. In many cases, the laser diode driver 204 provides drive currents at relatively high current in relatively short time periods to produce so-called gain-switched output pulses. The gain-switched output pulses are coupled to a first port 207 of a three port optical circulator 206. An injection laser 212 is coupled with an optical isolator 216 and an optical attenuator 218 to a second port 209 of the circulator 206. The circulator 206 thus couples optical power from the injection laser 212 to the laser diode 202, and optical power from the laser diode 202 to an output port 208 for delivery to a workpiece for material processing, as seed pulse for a fiber or other laser or amplifier, or for other applications. The injection laser 212 can be a distributed feedback (DFB) laser or a distributed Bragg reflector (DBR) laser or other laser with suitable spectral output. An injection laser driver 214 is coupled to the injection laser 212 so as to provide a suitable drive current to the injection laser 212. A temperature controller 222 establishes operating temperatures for the injection laser 212 and the seed laser 202. In convenient examples, the temperature controller is based on a thermoelectric device. A control system 224 selects drive current pulse amplitudes and durations, DC bias levels, pulse repetition rates, and timing delays between injection laser pulses and seed laser pulses.

In operation, one or both of the injection laser 212 or the seed laser 202 are set to temperatures by the temperature controller 222 so that an injection laser optical gain bandwidth overlaps a seed laser gain bandwidth. Typically, the injection laser and seed laser are matched to less than the mode separation of the seed laser so that only a single seed laser mode contributes to seed laser output. Wavelength versus temperature data for one or both lasers can be stored in memory and recalled as needed in operation. Alternatively, a temperature control setting can be fixed based on spectral measurements of gain bandwidths or emission wavelengths as a function of an applied temperature and drive currents. It is generally preferable to operate the injection laser 212 well above laser threshold to provide spectrally narrowed emission, and injection laser power is attenuated by the optical attenuator 218. In some examples, injection laser power coupled to the seed laser 202 is less than 10%, 5%, 2%, 1%, or 0.5% of total power emitted by the injection laser. A variable or fixed optical attenuator, a lossy splice, or a fiber coupler such with a fiber coupler with a 99%/1% split ratio can be used.

The injection laser driver 214 can provide a DC bias current to the injection laser 212. This DC bias current can serve to reduce the temperature changes and wavelength shifts caused by pulse currents. However, the DC bias also produces low level optical emission that can be output along with the desired seed pulse, and the effects of DC bias should be considered in any particular application. Low level background emission can be especially problematic when producing seed pulses to be amplified by high power, high gain optical amplifiers. By using pulse drive of the injection laser with pulses less than 100 ns, 50 ns, 25 ns, 10 ns, or shorter, the amount of unwanted injection power can be reduced as the injection laser power is required during seed pulse formation. Some injection laser power can be reflected by the seed laser 202 and co-propagate as well.

The injection laser 212 is selected to emit at a single wavelength within the gain bandwidth of the seed laser 202 (typically within 0.5, 0.2, 0.1, 0.05 times a mode separation) so that the seed laser emits in a narrow optical spectrum, typically, a single laser mode, with laser mode side modes that are at least 20, 40, 60, or 80 dB less than a central mode. The current pulse to the injection laser 212 is applied prior to applying a pulse current to the seed laser 202 so that the injection laser 212 is operating and injecting an optical signal to the seed laser 202 during pulse generation by the seed laser. For example, an injection laser pulse can be coupled to a laser diode seed laser as the laser diode is driven to produce a gain switched optical pulse. The seed laser 202 can also be driven with a DC bias as well as with pulses such as current pulses selected to produce gain switched optical pulses. As noted above, DC bias can produce DC optical emissions that can be problematic in high power laser systems and the DC background may be amplified result in unwanted heat and optical nonlinear effects.

Figure 3:
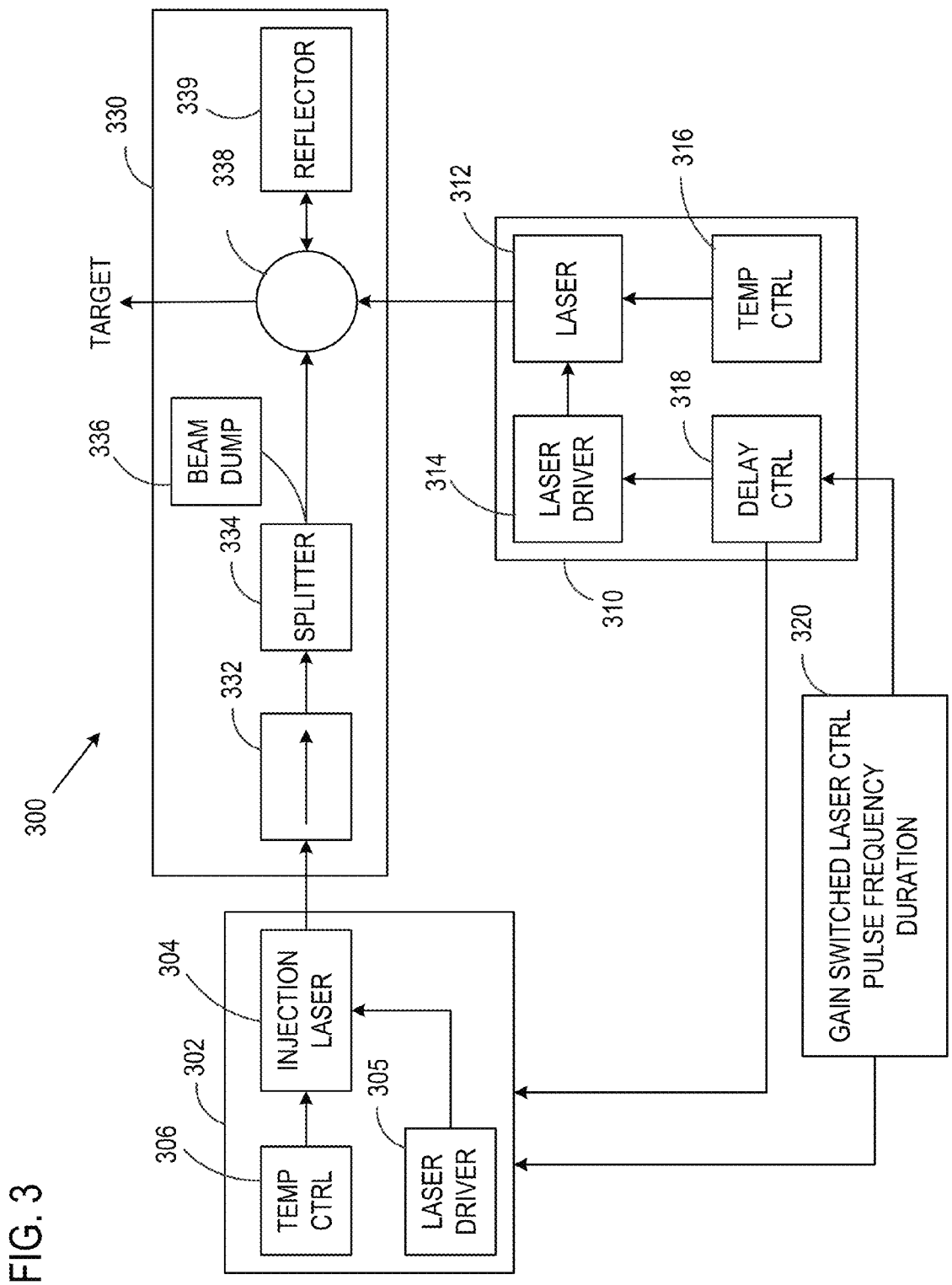
FIG. 3 is a block diagram of an injection locked, gain switched laser diode configured to pump a fiber laser.

FIG. 3 illustrates a representative laser system 300 that includes a spectral control laser system 302 that includes an injection locking laser 304 such as a DFB diode laser that is driven with current supplied by a driver 305. The driver 305 can provide pulsed or CW current for use in stabilizing gain switched pulse generation of a seed laser as discussed below. In one example, the injection laser 304 is a DBR laser provided by Photodigm, Inc. Richardson Tex. Injection laser drive pulse durations are generally 10-50 ns, and pulse amplitude are 10-250 mA. The injection laser driver 305 can also provide a constant DC drive, typically at a current level that is much smaller than the pulse current. The injection laser 304 is driven above threshold to provide narrowband optical emission for use in spectral control of a gain switched laser or other laser. A temperature controller 306 is in thermal contact with the injection laser 304 and can set a laser temperature so as to establish a center emission wavelength for the injection laser 304.

A seed laser system 310 is based on gain switching of a laser diode 312. A driver 314 provides suitable drive current amplitudes and pulse widths so as to produce gain switched optical pulses. Typical gain switched pulse widths range from 50 ps or shorter or 1 ns or longer. In one example, the seed laser 312 is a single frequency laser such as single mode DBR laser available from by Photodigm, Inc. Richardson Tex. Drive pulse widths are typically adjustable from about 200 ps to about 3 ns, and can include a DC bias component as well. Typical pulse drive currents range from about 50 mA to about 1 Å and DC bias currents range from 1 mA to about 40 mA, but DC bias is generally selected to be nor more than about 2-5% of the peak drive current. In other examples, the seed laser is a distributed Bragg reflector (DBR) laser, a volume Bragg grating (VBG) laser, or a Fabry-Perot laser. Although a Fabry-Perot laser can emit in multiple longitudinal modes, spectral control by the injection laser 304 can permit satisfactory suppression of all but one Fabry-Perot mode.

A delay controller 318 is coupled to the driver 304 to initiate the injection locking pulse, and then initiate a seed laser drive pulse with the driver 314, typically 40-60 ns later. A delay is generally selected so that an injection pulse is coupled to the seed laser during seed pulse generation. This delay can depend on electrical delays in drive pulse generation or propagation delays associated with propagation of an injection laser pulse to the seed laser 312. Delays can be provided electrically or with fiber delay lines, as needed. A thermoelectric temperature controller 316 is thermally coupled to the laser diode 312. The gain bandwidth of the injection locking laser 304 and the seed laser are temperature tuned so the wavelength of the injection laser output overlaps the gain bandwidth of the seed laser.

A controller 320 is coupled to the seed laser system 310 and the injection laser system 302. Typically, the controller is used to coordinate temperature setting with the temperature controllers 306, 316, select a pulse repetition rate, pulse duration, and pulse amplitude based on drive currents provided by the laser drivers as well as set pulse delays introduced with the delay controller 318.

The injection laser output is coupled to the seed laser 312 with an optical system 330 that includes an optical isolator 332, fiber power splitter 334, and a 4-port optical circulator 338. A beam dump 336 is coupled to the fiber power splitter to receive unwanted injection laser power. The circulator 338 couples a portion of the injection laser power to the seed laser 312 and then couples the seed laser output to a Bragg reflector 339 that then directs the seed laser output to a target such as a workpiece or gain media of an optical amplifier.

Figure 4:
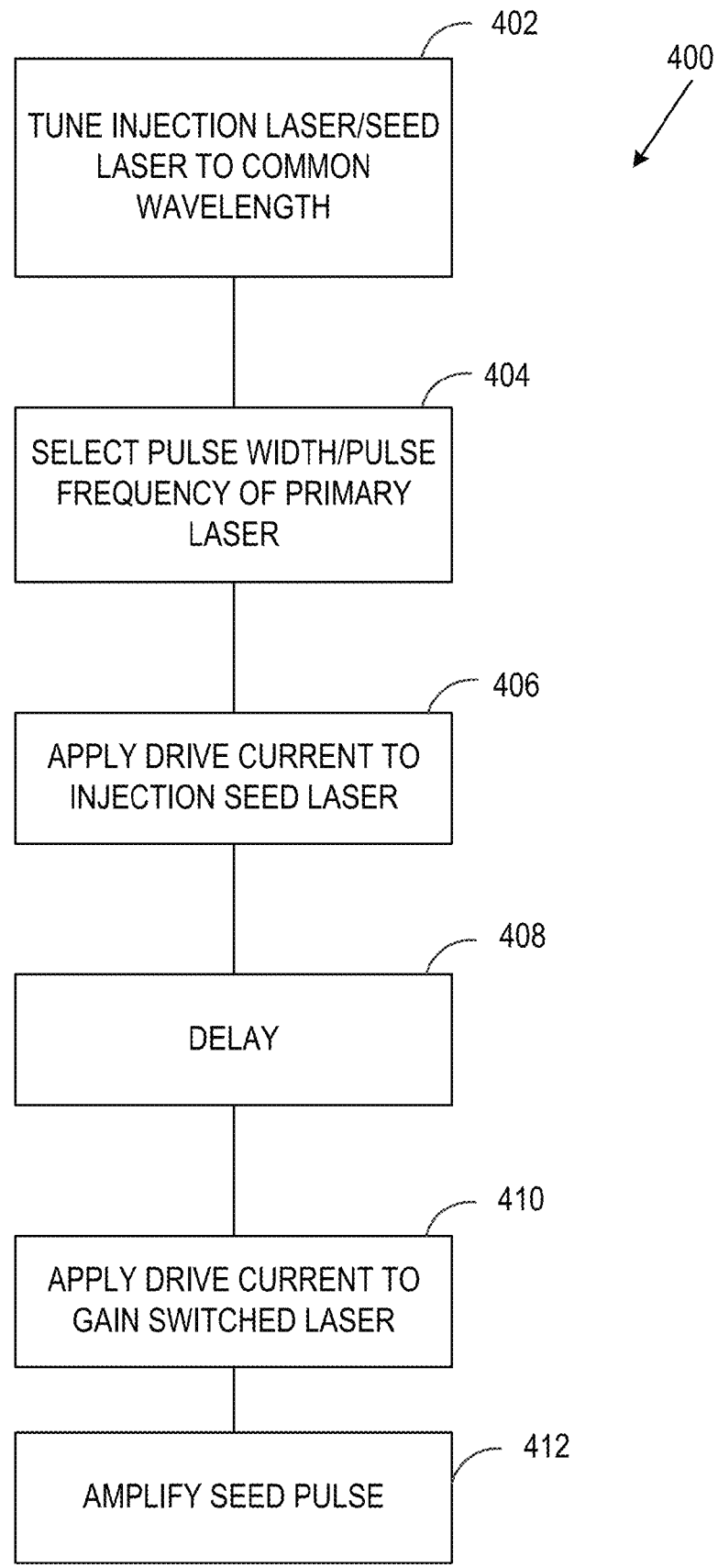
FIG. 4 is a block diagram of a representative method of producing repetitive high power laser pulses having stabilized pulse energies.

FIG. 4 illustrates a representative method 400 of producing amplitude-stabilized optical pulses at a user selected repetition rate. At 402, an injection laser and a laser to be used as a seed laser (for example, a gain switched laser diode) are temperature tuned to operate at a common wavelength or in overlapping gain bandwidths. Temperature tuning can be based on predetermined temperature tuning data stored in a memory based on tuning characteristics obtained with an optical spectrum analyzer. In other examples, one or both of the seed laser and the injection laser are tuned using optical filters, gratings, or other spectral discriminators that are coupled to the lasers. With such devices, spectral tuning is not restricted to initial or stored settings, and changes in laser characteristics are accommodated.

At 404, optical pulse properties such as pulse width, power, and repetition rate as are selected for the seed laser. In some cases, optical pulse properties are selectable based on seed laser or injection laser characteristics, and some selections are unavailable with some seed or injection laser selections. Based on the selected optical pulse properties, suitable drive currents are applied to the injection laser to produce optical emission that can be coupled to the seed laser. As noted above, in some examples, the injection laser can be operated to provide DC optical emission instead of or in addition to pulsed emission. After initiation of an injection laser pulse drive, a predetermined delay time is allowed to elapse at 408 so that the appropriate injection laser emission is available. At 410, a suitable drive current is applied to the seed laser based on the selected optical pulse characteristics. At 412, a seed laser pulse is directed to an optical amplifier such as a diode-pump doped fiber amplifier that is generally configured to substantially increase pulse power prior to beam delivery to a workpiece. In some examples, gain switched laser diode output power is sufficient, and amplification is not needed.

Figure 5A:
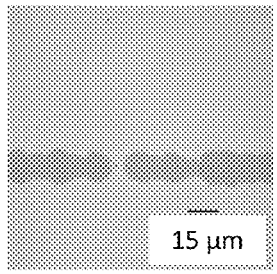
FIG. 5A illustrates an indium tin oxide (ITO) substrate processed with a pulsed laser system showing the effects of pulse energy variation. Pulse repetition rate is 120 kHz and pulse duration is 200 ps.
Figure 5B:
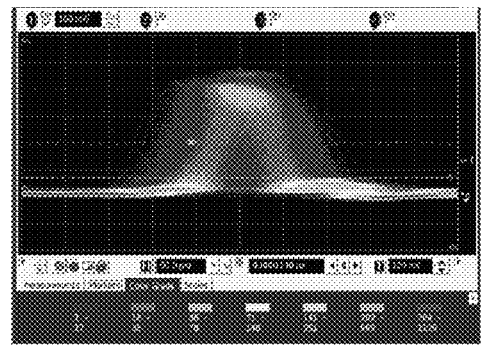
FIG. 5B shows pulse amplitude as a function of time illustrating substantial variations in pulse energy and pulse timing. The horizontal axis spans 500 ps at 50 ps/division.
Figure 6A:
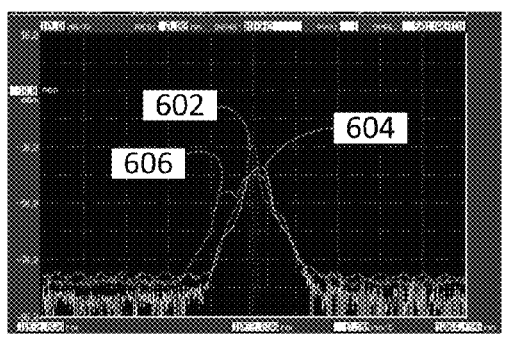
FIG. 6A illustrates optical spectra of injection locked and unlocked laser diodes along with an ideal single mode spectrum. Center wavelength is at about 1063 nm and a total wavelength range of about 4 nm is shown.
Figure 6B:
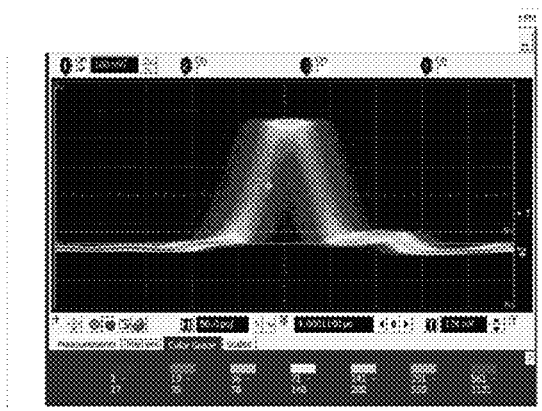
FIG. 6B shows pulse amplitude as a function of time illustrating substantially reduced variations in pulse energy and pulse timing via injection locking. The horizontal axis corresponds to the same total time and time scale as for FIG. 5B.

Using methods such as shown in FIG. 4, a repetitive optical pulse train is obtained, with improved pulse-to-pulse energy stability, and with consistent pulse amplitudes. FIGS. 5A-5B exhibit the deficiencies of conventional systems, and FIGS. 6A-6B exhibit some available improvements. FIG. 5A is an image of a processed indium tin oxide layer (ITO) on a glass substrate obtained with a conventional pulsed laser system based on gain switched seed pulses. The substrate was exposed to a repetitively pulsed optical beam that was directed to form a scribed line in the ITO. As is apparent from FIG. 5A, the line width is highly variable, and the line is not continuous due to pulses having inadequate pulse energy due to large variations in pulse amplitudes. FIG. 5B is a representation of pulse power as a function of time in which substantial variations in pulse power and large pulse jitter are apparent. FIG. 6A illustrates spectral improvement available with injection pulses. A curve 602 illustrates a single mode spectrum, while curves 604, 606 illustrate curves associated with injection laser based spectral control and without such control, respectively. Spectral narrowing with injection locking is apparent. FIG. 6B illustrates pulse power as a function of time in which power variations and pulse jitter are substantially reduced using injection locking as disclosed herein.

Figure 7:
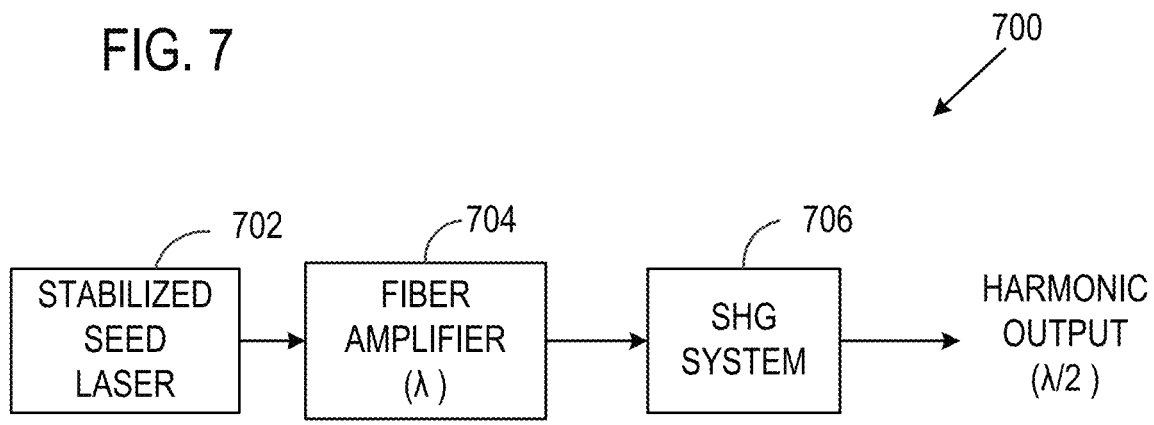
FIG. 7 is a block diagram of a system that includes an amplitude stabilized seed pulse and a fiber amplifier that produce an amplified beam that is directed to a nonlinear optical system.

Injection locking as described in the examples above stabilizes pulse powers and spectra. The resulting spectral narrowing also provides significant additional advantages. The narrow spectrum reduces or eliminates four wave mixing that could otherwise broaden the spectrum. Even at infrared wavelengths, reduced or eliminated four wave mixing avoids seeding Raman scattering (SRS) which can limit the available output power. While spectral narrowing reduces certain (and generally undesirable) nonlinear effects such as four wave mixing, spectral narrowing, other nonlinear effects can be enhanced. For example, sum frequency generation and harmonic generation efficiencies are improved. In some laser systems that produce laser emission at wavelengths near 1060 nm, more efficient second harmonic generation (SHG) to wavelengths around 530 nm can be achieved with pulses produced as disclosed above. As shown in FIG. 7, an optical harmonic generation system 700 includes an amplitude stabilized, pulsed seed laser system 702 coupled to a fiber amplifier 704. An amplified optical beam at a wavelength λ from the fiber amplifier 704 is directed to a nonlinear optical system 706 to produce an output beam at a wavelength λ/N, wherein N is a positive integer.

The above examples pertain generally to periodic single seed pulse generation. In another example, injection locking can be used to generate burst mode pulses. A seed laser is driven with a burst drive so as to produce a burst of seed pulses at a repetition rate of 10-100 MHz. A typical burst can include about 2-20 individual pulses. The burst drive can be applied periodically at rates of up to a several MHz. Amplitudes, pulse energies, and jitter associated with the pulses of the bursts can be control by directing an injection laser pulse to the seed laser during burst production. The injection laser is typically configured to provide an injection pulse having a duration at least as long as the burst duration. As discussed above, the injection laser and the seed laser are wavelength matched.

In view of the many possible embodiments to which the principles of the disclosed technology may be applied, it should be recognized that the illustrated embodiments are only representative examples and should not be taken as limiting the scope of the disclosure. We therefore claim as our invention all that comes within the scope and spirit of the appended claims.

We claim:

1. An apparatus, comprising:
    a primary laser system that includes a primary laser diode that emits primary laser pulses;
    a first optical system configured to attenuate the primary laser pulses;
    a secondary laser system that includes a secondary laser diode configured to receive the attenuated primary laser pulses from the first optical system and produce secondary laser pulses;
    a control system comprising a first temperature control system coupled to the primary laser diode and configured to set a wavelength associated with the primary laser pulses, based on a temperature of the primary laser diode, to correspond to a wavelength associated with the secondary laser diode, and to establish an optical pulse delay so that primary laser pulses are received at the secondary laser diode as respective secondary laser pulses are produced;
    a substrate stage; and
    a beam forming optical system configured to receive the secondary laser pulses and form a shaped optical beam, wherein the substrate stage and the beam forming optical system are configured to scan the shaped optical beam with respect to a substrate, and the shaped optical beam is scanned so that selected secondary laser pulses overlap at the substrate by less than one half of a shaped beam diameter.

2. The apparatus of claim 1, wherein the control system further comprises a second temperature control system that is coupled to the secondary laser and configured to set the wavelength associated with the secondary laser pulses to correspond to the wavelength associated with the primary laser based on a temperature of the secondary laser.

3. The apparatus of claim 2, wherein the primary laser system includes a primary laser driver and the secondary laser system includes a secondary laser driver, wherein the control system is coupled so that drive pulses produced by the primary laser driver and the secondary laser driver are initiated with a driver pulse delay based on the optical pulse delay.

4. The apparatus of claim 3, wherein the primary laser driver is configured to provide primary laser pulses have a pulse duration of less than 500 ns.

5. The apparatus of claim 3, wherein the primary laser driver is configured to provide primary laser pulses have a pulse duration of less than 100 ns.

6. The apparatus of claim 3, wherein the primary laser driver is configured to provide primary laser pulses have a pulse duration of less than 10 ns.

7. The apparatus of claim 1, further comprising an optical amplifier that includes an actively doped optical fiber and a pump source, configured to receive the secondary laser pulses and produce amplified pulses having an output spectrum based on a spectrum of the secondary laser pulses.

8. The apparatus of claim 1, wherein the first optical system includes at least one of a lossy fiber splice or a fiber coupler situated to attenuate the primary laser pulses.

9. The apparatus of claim 8, wherein the first optical system provides an attenuation of at least 10 dB.

10. The apparatus of claim 8, wherein the first optical system provides an attenuation of at least 20 dB.

11. The apparatus of claim 2, wherein the primary laser is a distributed feedback laser.

12. The apparatus of claim 1, wherein the secondary laser is a microchip laser.

13. The apparatus of claim 1, wherein the delay is less than 100 ns and greater than 1 ns.

14. The apparatus of claim 1, wherein the secondary laser is a gain-switched laser diode.

15. The apparatus of claim 1, comprising an optical circulator configured to couple the optical power from the primary laser system to the secondary laser system.

16. A pulsed fiber laser system, comprising:
    a fiber amplifier that includes an actively doped optical fiber and a pump source configured to pump the actively doped optical fiber to provide optical gain;
    a seed laser system configured to provide spectrally controlled seed laser pulses to the fiber amplifier, wherein the seed laser system includes a gain switched laser diode configured to provide the spectrally controlled seed laser pulses, and an injection locking laser diode providing injection locking laser pulses optically coupled to the gain switched laser diode so as to spectrally control the seed laser pulses;
    a delay generator coupled to the gain switched laser diode and configured to delay initiation of each seed laser pulse such that an injection locking laser pulse is received at the gain switched laser diode during seed pulse generation so that each seed laser pulse is spectrally controlled;
    a temperature controller configured to tune emission wavelengths of at least one of the gain switched laser diode and the injection locking laser diode to a common wavelength;
    a substrate stage; and
    a beam forming optical system configured to receive amplified seed pulses from the fiber amplifier and form a shaped optical beam, wherein the substrate stage and the beam forming optical system are configured to scan the shaped optical beam with respect to a substrate and the shaped optical beam is scanned so that selected amplified seed pulses overlap at the substrate by less than one half of a shaped beam diameter;
    wherein the amplified seed pulses are produced at a repetition rate of between 1 kHz and 1 MHz.

17. The pulsed fiber laser system of claim 16, wherein the seed laser system includes an optical attenuator configured to attenuate the pulses from the injection locking laser by at least 10 dB, and couple the attenuated pulses to the gain switched laser diode.

18. The pulsed fiber laser system of claim 17, wherein the injection locking laser is a distributed feedback (DFB) laser, a distributed Bragg reflector (DBR) laser, or a volume Bragg grating (VBG) laser.

19. The pulsed fiber laser system of claim 17, wherein the gain switched laser diode is a distributed feedback (DFB) laser, a distributed Bragg reflector (DBR) laser, a volume Bragg grating (VBG) laser, or a Fabry-Perot laser.

20. The pulsed fiber laser system of claim 16, further comprising a nonlinear optical system configured to receive amplified seed pulses from the fiber amplifier and produce an optical harmonic of the amplified seed pulses.

21. A pulsed fiber laser system, comprising:
- a fiber amplifier that includes an actively doped optical fiber and a pump source configured to pump the actively doped optical fiber to provide optical gain;
- a seed laser system configured to provide spectrally controlled seed laser pulses to the fiber amplifier, wherein the seed laser system includes a gain switched laser diode configured to provide the spectrally controlled seed laser pulses, an injection locking laser diode providing injection locking laser pulses optically coupled to the gain switched laser diode so as to spectrally control the seed laser pulses, and an optical attenuator configured to attenuate the pulses from the injection locking laser by at least 10 dB and couple the attenuated pulses to the gain switched laser diode;
- a delay generator coupled to the gain switched laser diode and configured to delay initiation of each seed laser pulse such that an injection locking laser pulse is received at the gain switched laser diode during seed pulse generation so that each seed laser pulse is spectrally controlled;
- a temperature controller configured to tune emission wavelengths of at least one of the gain switched laser diode and the injection locking laser diode to a common wavelength;
- a substrate stage; and
- a beam forming optical system configured to receive amplified seed pulses from the fiber amplifier and form a shaped optical beam, wherein the substrate stage and the beam forming optical system are configured to scan the shaped optical beam with respect to a substrate;
- wherein the gain switched laser diode is a distributed feedback (DFB) laser, a distributed Bragg reflector (DBR) laser, a volume Bragg grating (VBG) laser, or a Fabry-Perot laser; and the amplified seed pulses are produced at a repetition rate of between 1 kHz and 1 MHz, and the shaped optical beam is scanned so that selected amplified seed pulses overlap at the substrate by less than one half of a shaped beam diameter.

22. A method, comprising:
- tuning a first laser diode and a second laser diode to a common wavelength by adjusting a temperature of at least one of the first laser diode and the second laser diode, wherein the first laser diode is a single mode laser diode;
- directing portions of optical pulses from the first laser diode to the second laser diode;
- delaying the generation of pulses from the second laser diode until the portions of the optical pulses from the first laser diode are received; and
- generating pulses with the second laser diode as the portion of the optical pulses from the first laser diode are received so as to control a spectrum of the generated pulses;
- wherein the portions of the optical pulses from the first laser diode are coupled so that side mode amplitudes in the spectrally controlled pulses from the second laser diode are attenuated by at least 10 dB with respect to spectrally uncontrolled pulses from the second laser diode.

23. The method of claim 22, wherein generating pulses with the second laser diode comprises gain switching the second laser diode.

24. The method of claim 22, wherein generating pulses with the second laser diode comprises generating a burst of pulses having a burst duration, and at a repetition rate of from 10 to 100 MHz.

25. The method of claim 24, wherein directing portions of optical pulses from the first laser diode to the second laser diode comprises directing at least one optical pulse from the first laser diode to the second laser diode, the at least one optical pulse having a duration at least as long as the burst duration.

* * * * *